United States Patent
Bae et al.

(10) Patent No.: US 6,856,088 B2
(45) Date of Patent: Feb. 15, 2005

(54) ORGANIC ELECTROLUMINESCENCE DISPLAY DEVICE AND METHOD OF FABRICATING THE SAME

(75) Inventors: Sung-Joon Bae, Seongnam-si (KR); Jae-Yoon Lee, Seoul (KR); Doo-Hyun Ko, Seongnam-si (KR); Kyung-Man Kim, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/329,539

(22) Filed: Dec. 27, 2002

(65) Prior Publication Data

US 2003/0127977 A1 Jul. 10, 2003

(30) Foreign Application Priority Data

Dec. 31, 2001 (KR) .................................. 10-2001-0089326
Dec. 31, 2001 (KR) .................................. 10-2001-0089301

(51) Int. Cl.$^7$ ................................................ H01J 1/62
(52) U.S. Cl. ............................ 313/504; 445/24; 427/66
(58) Field of Search ................................. 313/502–504, 313/506; 445/24–25; 427/66

(56) References Cited

U.S. PATENT DOCUMENTS

| 5,725,651 | A  | * | 3/1998  | Zambounis et al. ......... 106/497 |
| 6,007,928 | A  | * | 12/1999 | Sakakibara et al. ......... 428/690 |
| 6,372,154 | B1 | * | 4/2002  | Li ........................... 252/301.16 |
| 6,413,655 | B2 | * | 7/2002  | Otani et al. ................. 428/690 |
| 6,445,128 | B1 | * | 9/2002  | Bush et al. ................. 313/509 |
| 6,451,458 | B1 | * | 9/2002  | Sakakibara et al. ......... 428/690 |

* cited by examiner

Primary Examiner—Joseph Williams
Assistant Examiner—German Colón
(74) Attorney, Agent, or Firm—Morgan Lewis & Bockius LLP

(57) ABSTRACT

A method of fabricating an organic electroluminescence display device includes the steps of forming a first electrode; forming an emissive layer on the first electrode using a solvent and a polymer, the solvent having a surface tension less than 30 dyne/cm and a boiling point greater than 200 degrees centigrade; and forming a second electrode on the emissive layer.

20 Claims, 4 Drawing Sheets

ORGANIC ELECTROLUMINESCENCE DISPLAY DEVICE AND METHOD OF FABRICATING THE SAME

The present application claims the benefit of Korean Patent Application Nos. P2001-089301 and P2001-089326 both of which were filed in Korea on Dec. 31, 2001, and are hereby incorporated by reference.

BACKGROUND OF THE INVENTION

1. Field of the Invention

The present invention relates to an electroluminescence display device, and more particularly, to an organic electroluminescence display device and a method of fabricating the same.

2. Discussion of the Related Art

Cathode ray tube displays have been widely used as display devices for televisions and computer monitors. However, cathode ray tubes have large size, large weight, and high driving voltage. Therefore, flat panel displays—which are thin, light weight, and low in power consumption—have been in demand. Such flat panel displays include liquid crystal display devices, plasma display panel devices, field emission display devices, and electroluminescence display devices.

The electroluminescence display device may be categorized into inorganic electroluminescence display devices and organic electroluminescence display devices depending upon the source material for exciting carriers. Organic electroluminescence display devices have drawn considerable attention due to their high brightness, low driving voltage, and natural color images throughout the entire visible light range. Additionally, organic electroluminescence display devices have superior contrast ratio because of their self-luminescence. Organic electroluminescence display devices can easily display moving images due to its short response time of several microseconds and are not limited by a specific viewing angle. Organic electroluminescence display devices are stable at low temperatures, and their driving circuit can be easily fabricated because they are driven by a low voltage. In addition, the manufacturing process for organic electroluminescence display devices is relatively simple.

In general, an organic electroluminescence display device emits light by injecting electrons from a cathode electrode and holes from an anode electrode into an emissive layer. The electrons combine with the holes, thereby generating an exciton. The exciton then transitions from an excited state to a ground state to emit light. Since its luminous mechanism is similar to a light emitting diode, the organic electroluminescence display device may be called an organic light emitting diode (OLED).

FIG. 1 shows a band diagram of a related art organic electroluminescence display device. As shown in FIG. 1, the related art organic electroluminescence display device includes an anode electrode 1, a cathode electrode 7, a hole transporting layer 3, an emissive layer 4, and an electron transporting layer 5 disposed between the anode electrode 1 and the cathode electrode 7. The related art organic electroluminescence display device further includes a hole injection layer 2 disposed between the anode electrode 1 and the hole transporting layer 3, and an electron injection layer 6 disposed between the cathode electrode 7 and the electron transporting layer 5. The hole and electron injection layers 2 and 6 facilitate efficient injection of holes and electrons, respectively.

The holes are injected into the emissive layer 4 through the hole injection layer 2 and the hole transporting layer 3 from the anode electrode 1. The electrons are injected into the emissive layer 4 through the electron injection layer 7 and the electron transporting layer 5 from the cathode electrode 7. Together, a hole and an electron generate an exciton 8 in the emissive layer 4. Then, light corresponding to energy between the hole and the electron is emitted from the exciton 8.

The anode electrode 1 is formed of a transparent conductive material having a relatively high work function, such as indium-tin-oxide. The light from the electroluminescence display device is observed at the anode electrode 1. On the other hand, the cathode electrode 7 is formed of an opaque conductive material having a relatively low work function, such as aluminum, calcium, and aluminum alloy.

FIG. 2 is a plan view of a related art organic electroluminescence display device. As shown in FIG. 2, a plurality of first electrodes 12 are formed horizontally on a transparent substrate 10, and a plurality of second electrodes 13 are formed vertically on the transparent substrate 10. The plurality of first electrodes 12 and the plurality of second electrodes 13 cross each other to form a matrix. An organic layer 14 is formed between the first electrodes 12 and the second electrodes 13.

FIG. 3 is a cross-sectional view of showing a portion of the related art organic electroluminescence display device of FIG. 2. As shown in FIG. 3, the first electrode 12 is formed on the transparent substrate 10, and a hole injection layer 15 is formed on the first electrode 12. An organic emissive layer 17 is formed on the hole injection layer 15, and an electron injection layer 19 is formed on the organic emissive layer 17. The second electrode 13 is formed on the electron injection layer 19. As stated above, although not shown in FIG. 3, a hole transporting layer and an electron transporting layer may be formed between the hole injection layer 15 and the organic emissive layer 17 as well as between the organic emissive layer 17 and the electron injection layer 19, respectively.

The first electrode 12 is made of a transparent conductive material such as indium-tin-oxide (ITO), and injects holes into the organic emissive layer 17 through the hole injection layer 15. Therefore, the first electrode 12 is an anode electrode. The second electrode 13 injects electrons into the organic emissive layer 17 through the electron injection layer 19. Thus, the second electrode 13 is a cathode electrode.

The organic emissive layer 17 is made of a polymer or a monomer. An organic emissive layer made of the monomer has a high purity. However, it is difficult to form the organic emissive layer of a monomer because a depositing method, such as a chemical vapor deposition or a thermal deposition, is needed. Furthermore, the organic emissive layer made of the monomer requires a high driving voltage, and is not thermally stable.

On the other hand, because an organic emissive layer made of the polymer is formed by an inkjet method or a coating method, such as a spin coating or a roll coating, the organic emissive layer made of the polymer is easily manufactured. The organic emissive layer made of the polymer has a high thermal stability. In addition, a low driving voltage can be used to drive a polymer organic emissive layer.

Generally, in the roll coating method, the polymer is dissolved in a solvent and is coated on a substrate as a mixture by using a roller. Next, the solvent is evaporated, and thus, only the polymer remains. The solvent is made of a material that has a low boiling point and is easily evaporated. Xylenes or O-Dichloro Benzene are widely used as solvents. However, since Xylenes have a boiling point of about 145 degrees centigrade and O-Dichloro Benzene has a boiling point of about 180 degrees centigrade, Xylenes and O-Dichloro Benzene are easily evaporated. Therefore, solubility of the polymer is lowered such that the organic emissive layer coated on the substrate has bad properties.

FIG. 4 is a scanning electron microscope (SEM) photograph showing a surface of an organic emissive layer formed by using O-Dichloro Benzene as a solvent. Here, an evaporation rate of O-Dichloro Benzene is about 0.15 fractional weight per minute. As shown in FIG. 4, the surface of the organic emissive layer has grains of various sizes, which are in a tangle.

In the alternative, Ethyl Benzoate or 2-Butoxy Ethanol may be used as the solvent. FIGS. 5 and 6 are scanning electron microscope (SEM) photographs showing a surface of an organic emissive layer according to the related art.

In FIG. 5, Ethyl Benzoate is used as a solvent. Ethyl Benzoate has a high surface tension of about 34 dyne/cm. As shown in FIG. 5, the organic emissive layer has poor coating characteristics due to the high surface tension.

In FIG. 6, 2-Butoxy Ethanol is used as a solvent in a mixture together with a polymer. Because the solubility of the polymer in 2-Butoxy Ethanol is less than about 1 wt. %, the polymer or organic emissive material is precipitated during the roll coating. Thus, the organic emissive layer has poor characteristics due to the low solubility.

SUMMARY OF THE INVENTION

Accordingly, the present invention is directed to an organic electroluminescence display device and a method of fabricating the same that substantially obviates one or more of the problems due to limitations and disadvantages of the related art.

An object of the present invention is to provide an organic electroluminescence display device and a method of fabricating the same that improves characteristics of an organic emissive layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an organic electroluminescence display device comprises the steps of forming a first electrode; forming an emissive layer on the first electrode using a solvent and a polymer, the solvent having a surface tension less than 30 dyne/cm and a boiling point greater than 200 degrees centigrade; and forming a second electrode on the emissive layer.

In another aspect, a method of fabricating an organic electroluminescence display device comprises the steps of forming a first electrode; forming an emissive layer on the first electrode using a solvent and a polymer, the solvent including a first material, a second material and a third material, the polymer having a solubility greater than about 1 percent weight per volume in the first material, the second material having an evaporation rate less than 0.1 fractional weight per minute, the third material having a surface tension less than 30 dyne/cm; and forming a second electrode on the emissive layer.

In another aspect, an organic electroluminescence display device comprises a first electrode; an emissive layer on the first electrode; and a second electrode on the emissive layer, wherein the emissive layer is deposited using a solvent and a polymer, the solvent having a surface tension less than 30 dyne/cm and a boiling point greater than about 200 degrees centigrade.

In another aspect, an organic electroluminescence display device comprises a first electrode; an emissive layer on the first electrode; and a second electrode on the emissive layer, wherein the emissive layer is formed using a solvent and a polymer, the solvent including a first material, a second material and a third material, the polymer having a solubility greater than about 1 percent weight per volume in the first material, the second material having an evaporation rate less than 0.1 fractional weight per minute, the third material having a surface tension less than 30 dyne/cm.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
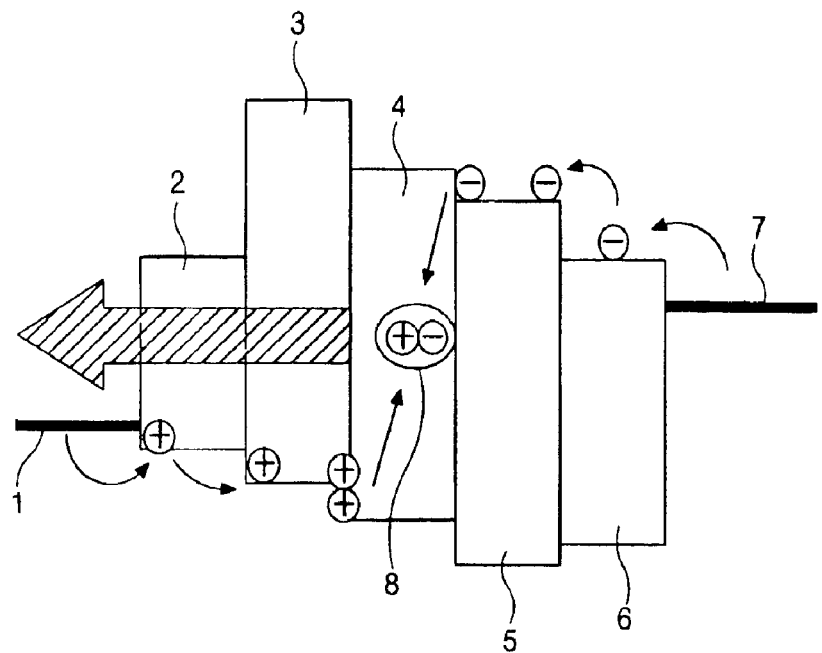
FIG. 1 is a band diagram of a related art organic electroluminescence display device.
Figure 2:
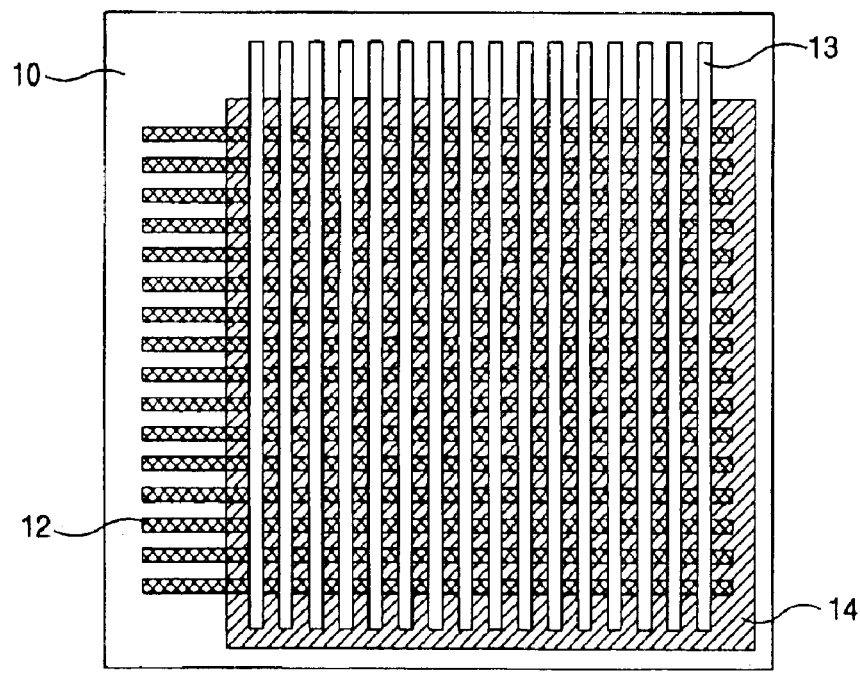
FIG. 2 is a plan view of a related art organic electroluminescence display device.
Figure 3:
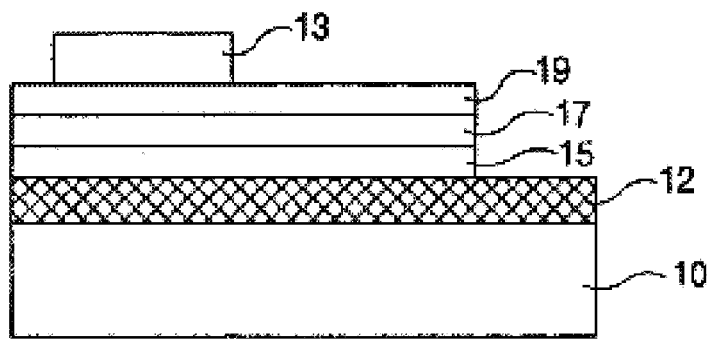
FIG. 3 is a cross-sectional view of a portion of the related art organic electroluminescence display device.
Figure 4:
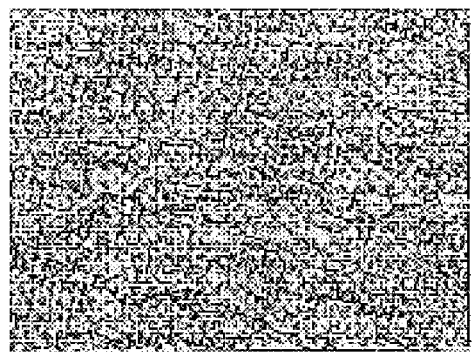
FIGS. 4 through 6 are scanning electron microscope (SEM) photographs showing a surface of an organic emissive layer according to the related art.
Figure 5:
Figure 6:
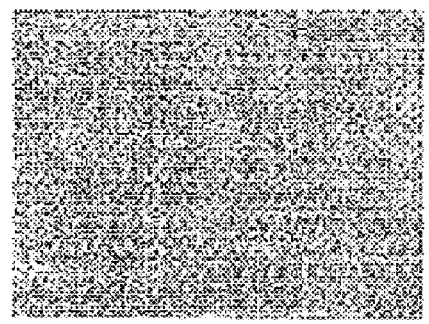
Figure 7:
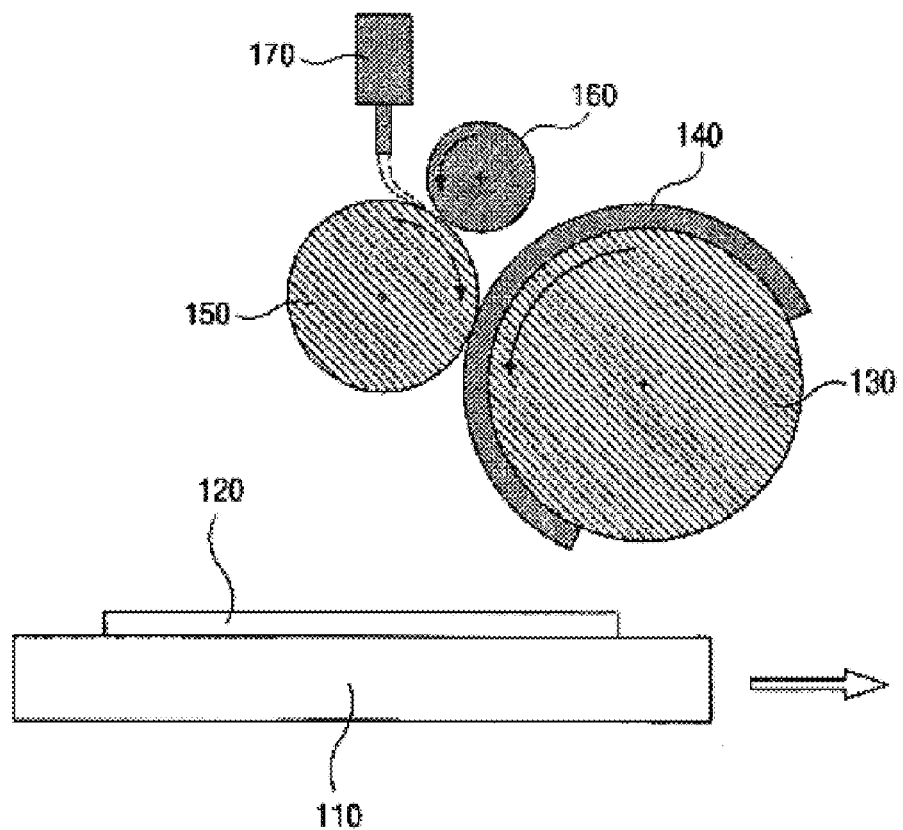
FIG. 7 is a schematic view showing an exemplary roll coating apparatus for forming an organic emissive layer of an organic electroluminescence display device according to the present invention.

FIG. 7 shows an exemplary roll coating apparatus for forming an organic emissive layer of an organic electroluminescence display device according to the present invention.

As shown in FIG. 7, the roll coating apparatus includes a stage 110, a print roll 130, an anilox roll 150, a doctor roll 160, and a dispenser 170. A substrate 120 is located on the stage 110, which moves from side to side, and the print roll 130 is arranged over the substrate 120. The print roll 130 is covered with a resin plate 140, the surface of which is embossed to form an organic emissive layer in a desired region. The anilox roll 150 is arranged at the side of the print roll 130, and rotates in gear with the print roll 130. The doctor roll 160 is arranged at the side of the anilox roll 150, and the dispenser 170 is arranged over the anilox roll 150. The dispenser 170 injects a polymer dissolved in a solvent. The doctor roll 160 rotates in gear with the anilox roll 150, thereby making the polymer dissolved in the solvent spread with a uniform thickness on the surface of the anilox roll 150. The print roll 130 transfers the polymer dissolved in the solvent from the anilox roll 150 to the substrate 120.

Specifically, the surface of the anilox roll 150 receives the mixture of the polymer and the solvent injected from the dispenser 170, and the mixture is spread with a uniform thickness on the surface of the anilox roll 150 by being disposed between the doctor roll 160 and the anilox roll 150. Next, the resin plate 140 covering the print roll 130 is stained with the mixture. The resin plate 140 having the mixture touches the substrate 120 according to rotation of the print roll such that the mixture is coated on the substrate 120 in an embossing fashion. Next, the solvent is evaporated to form an organic emissive layer having a substantially uniform thickness without grains.

To prevent the solvent from evaporating during the coating, the solvent preferably has a boiling point greater than about 200 degrees centigrade. Additionally, the solvent preferably has a surface tension less than about 30 dyne/cm. The solvent may include, for example, one of Diphenyl Ether, Tridecane, Dodecane, Butyl Maleate, dl-α-Terpinol, Octanoic Acid, and Hexanoic Acid.

Table 1 below shows characteristic of the solvents according to a first embodiment of the present invention.

TABLE 1

| Solvent | Boiling point (degrees centigrade) | Surface tension (dyne/cm) |
| --- | --- | --- |
| Diphenyl Ether | 258.06 | 26.93 (30 degrees) |
| Tridecane | 235.46 | 25.55 |
| Dodecane | 216.33 | 24.9 |
| Butyl Maleate | 280 | 28.7 (20 degrees) |
| dl-α-Terpinol | 217.5 | 28.65 |
| Octanoic Acid | 239.9 | 28.7 |
| Hexanoic Acid | 205 | 27.55 |

Figure 8:
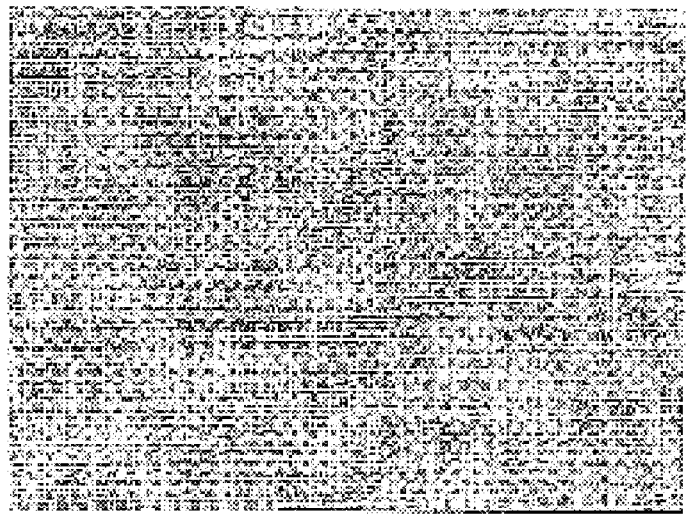
FIG. 8 is a scanning electron microscope (SEM) photograph showing a surface of an organic emissive layer according to an embodiment of the present invention.

FIG. 8 is a scanning electron microscope (SEM) photograph showing a surface of an organic emissive layer according to a first embodiment of the present invention. In FIG. 8, Diphenyl Ether is used as a solvent, and the organic emissive layer is formed by the roll coating apparatus of FIG. 7. As shown in FIG. 8, the organic emissive layer has a uniform surface without grains.

On the other hand, in order to improve characteristics of the coated organic emissive layer, not only should the solvent preferably have a surface tension less than about 30 dyne/cm, but also the solvent should preferably have an evaporation rate less than about 0.1 fractional weight per minute and a solubility of the polymer in the solvent should be greater than about 1.0 percent weight per volume (wt/v %). However, while the foregoing embodiments provide improved results, there is no single solvent that satisfies all of the above conditions.

Therefore, in another embodiment of the present invention, the solvent includes a first material, a second material, and a third material. Preferably, the polymer has a solubility greater than 1 percent weight per volume in the first material, the second material has an evaporation rate less than about 0.1 fractional weight per minute, and the third solvent has a surface tension less than about 30 dyne/cm. The first solvent may include one of Xylenes, Tetralin, Cyclo Hexyl Benzene, Chloro Form, Tetra Hydro Furane, Ethyl Benzoate, and Methyl Benzoate. The second solvent may include one of Cyclo Hexyl Pyrrolidone, N-Methyl-2-Pyrrolidone (NMP), γ-Butyrolactone, Ethylene Glycol, Dodecane, Ethyl Cinamate. The third solvent may include one of 2-Butoxy Ethanol, Metylene Chloride, Acetone, n-Butyl Benzene, Toluene, iso-Pentyl Ether, and iso-Butyl Benzene.

Figure 9:
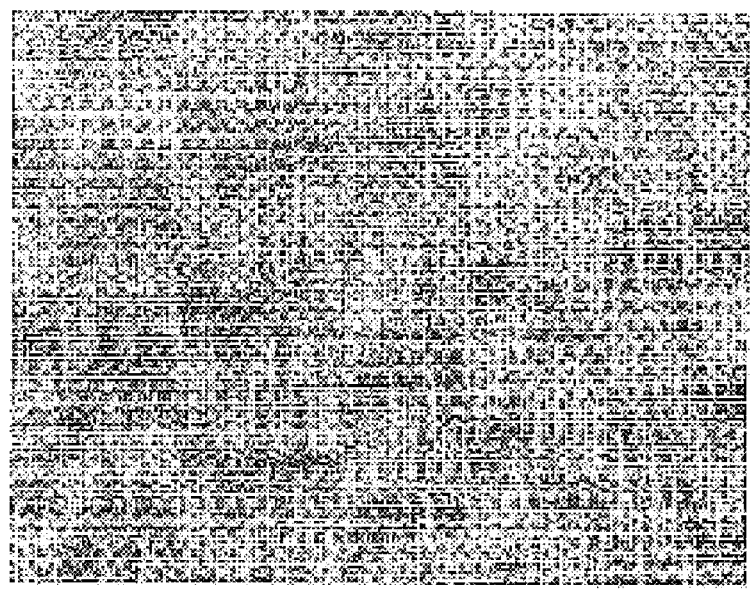
FIG. 9 is a scanning electron microscope (SEM) photograph showing a surface of an organic emissive layer according to another embodiment of the present invention.

FIG. 9 is a scanning electron microscope (SEM) photograph showing a surface of an organic emissive layer according to an embodiment of the present invention having first, second, and third materials as described above. As shown in the FIG. 9, there are no grains in the surface of the organic emissive layer, and the surface is uniform.

It will be apparent to those skilled in the art that various modifications and variations can be made in the organic electroluminescence display device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescence display device, comprising the steps of:
   forming a first electrode;
   forming an emissive layer on the first electrode using a solvent and a polymer, the solvent having a surface tension less than 30 dyne/cm and a boiling point greater than 200 degrees centigrade, wherein the polymer is dissolved in the solvent; and
   forming a second electrode on the emissive layer.

2. The method according to claim 1, wherein the solvent includes at least one of Diphenyl Ether, Tridecane, Dodecane, Butyl Maleate, dl-α-Terpinol, Octanoic acid, and Hexanoic acid.

3. The method according to claim 1, wherein the step of forming an emissive layer includes using a roll coating method.

4. The method according to claim 1, wherein the emissive layer has a substantially uniform thickness substantially without grains.

5. A method of fabricating an organic electroluminescence display device, comprising the steps of:
   forming a first electrode;
   forming an emissive layer on the first electrode using a solvent and a polymer, the solvent including a first material, a second material and a third material, the polymer having a solubility greater than about 1 percent weight per volume in the first material, the second material having an evaporation rate less than 0.1 fractional weight per minute, the third material having a surface tension less than 30 dyne/cm; and
   forming a second electrode on the emissive layer.

6. The method according to claim 5, wherein the first material includes at least one of Xylenes, Tetralin, Cyclo Hexyl Benzene, Chloro Form, Tetra Hydro Furane, Ethyl Benzoate, and Methyl Benzoate.

7. The method according to claim 5, wherein the second material includes at least one of Cyclo Hexyl Pyrrolidone, N-Methyl-2-Pyrrolidone (NMP), γ-Butyrolactone, Ethylene Glycol, Dodecane, Ethyl Cinamate.

8. The method according to claim 5, wherein the third material includes at least one of 2-Butoxy Ethanol, Metylene Chloride, Acetone, n-Butyl Benzene, Toluene, iso-Pentyl Ether, and iso-Butyl Benzene.

9. The method according to claim 5, wherein the step of forming an emissive layer includes using a roll coating method.

10. The method according to claim 5, wherein the emissive layer has a substantially uniform thickness substantially without grains.

11. An organic electroluminescence display device, comprising:

a first electrode;

an emissive layer on the first electrode; and a second electrode on the emissive layer, wherein the emissive layer is deposited using a solvent and a polymer such that the polymer is dissolved in the solvent, the solvent having a surface tension less than 30 dyne/cm and a boiling point greater than about 200 degrees centigrade.

12. The device according to claim 11, wherein the solvent includes at least one of Diphenyl Ether, Tridecane, Dodecane, Butyl Maleate, dl-α-Terpinol, Octanoic acid, and Hexanoic acid.

13. The device according to claim 11, wherein the emissive layer is formed by a roll coating method.

14. An organic electroluminescence display device, comprising:

a first electrode;

an emissive layer on the first electrode; and a second electrode on the emissive layer, wherein the emissive layer is formed using a solvent and a polymer, the solvent including a first material, a second material and a third material, the polymer having a solubility greater than about 1 percent weight per volume in the first material, the second material having an evaporation rate less than 0.1 fractional weight per minute, the third material having a surface tension less than 30 dyne/cm.

15. The device according to claim 14, wherein the emissive layer has a substantially uniform thickness substantially without grains.

16. The device according to claim 14, wherein the first material includes at least one of Xylenes, Tetralin, Cyclo Hexyl Benzene, Chloro Form, Tetra Hydro Furane, Ethyl Benzoate, and Methyl Benzoate.

17. The device according to claim 14, wherein the second material includes at least one of Cyclo Hexyl Pyrrolidone, N-Methyl-2-Pyrrolidone (NMP), γ-Butyrolactone, Ethylene Glycol, Dodecane, Ethyl Cinamate.

18. The device according to claim 14, wherein the third material includes at least one of 2-Butoxy Ethanol, Metylene Chloride, Acetone, n-Butyl Benzene, Toluene, iso-Pentyl Ether, and iso-Butyl Benzene.

19. The device according to claim 14, wherein the emissive layer is formed by a roll coating method.

20. The device according to claim 14, further comprising a transparent substrate, one of the first and second electrodes being on the transparent substrate.

* * * * *